(12) United States Patent
Suzunaga

(10) Patent No.: US 6,885,249 B2
(45) Date of Patent: Apr. 26, 2005

(54) OPTICAL SIGNAL RECEIVING CIRCUIT AND OPTICAL SIGNAL RECEIVING SEMICONDUCTOR DEVICE

(75) Inventor: Hiroshi Suzunaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/458,300

(22) Filed: Jun. 11, 2003

(65) Prior Publication Data

US 2004/0100317 A1 May 27, 2004

(30) Foreign Application Priority Data

Nov. 27, 2002 (JP) ........................................ 2002-344054

(51) Int. Cl.[7] .............................. H03F 3/08; H01J 40/14
(52) U.S. Cl. .................................. 330/308; 250/241 A
(58) Field of Search ................ 330/59, 308; 250/214 A, 250/214 AG

(56) References Cited

U.S. PATENT DOCUMENTS 5,247,211 A  9/1993 Sakura ......................... 327/72
5,777,507 A  7/1998 Kaminishi et al. ........... 327/514
6,038,049 A  * 3/2000 Shimizu et al. .......... 250/214 A
6,072,366 A  * 6/2000 Maeda et al. ................ 330/308

FOREIGN PATENT DOCUMENTS

JP          63-25738        5/1988

* cited by examiner

*Primary Examiner*—Khanh Van Nguyen
(74) *Attorney, Agent, or Firm*—Oblon, Spivak, McClelland, Maier & Neustadt, P.C.

(57) ABSTRACT

An optical signal receiving circuit disclosed herein comprises: a first transimpedance amplifier configured to convert a first current signal into a first voltage signal, wherein the first current signal is generated in a first photodiode, to which an optical signal is inputted; a reference voltage generating circuit configured to generate a second voltage signal which is independent of the first voltage signal and which is a signal of a reference voltage; a level shift circuit configured to shift at least one of the first voltage signal and the second voltage signal in a close direction and output it, wherein the close direction is a direction in which the center voltage of the amplitude of the first voltage signal and the voltage of the second voltage signal get closer; and a differential amplifier which amplifies a difference between the first voltage signal and the second voltage signal.

26 Claims, 16 Drawing Sheets

US 6,885,249 B2

OPTICAL SIGNAL RECEIVING CIRCUIT AND OPTICAL SIGNAL RECEIVING SEMICONDUCTOR DEVICE

CROSS REFERENCE TO RELATED APPLICATION

This application claims benefit of priority under 35 U.S.C. § 119 to Japanese Patent Application No. 2002-344054, filed on Nov. 27, 2002, the entire contents of which are incorporated by reference herein.

BACKGROUND OF THE INVENTION

1. Field of the Invention

The present invention relates to an optical signal receiving circuit and an optical signal receiving semiconductor device used for a digital signal photocoupler, an optical digital data link, and the like.

2. Description of the Related Art

FIG. 7 is a block diagram showing the circuit configuration of a related digital optical signal receiving circuit 5, and FIG. 8A and FIG. 8B are diagrams showing voltage waveforms in various nodes of the optical signal receiving circuit 5.

As shown in FIG. 7, the related optical signal receiving circuit 5 includes photodiodes 10 and 12, transimpedance amplifiers 14 and 16, a differential amplifier 20, a comparator 22, an output circuit 24, and a light shield 30.

An optical signal is inputted to the photodiode 10, and the photodiode 10 generates a current signal in response to the optical signal. The current signal is converted into a voltage signal in the transimpedance amplifier 14. An example of this voltage signal is S1 in FIG. 8A. This voltage signal S1 is then inputted to the differential amplifier 20.

On the other hand, no optical signal is inputted to the dummy photodiode 12 since the light shield 30 is provided for the dummy photodiode 12, and hence the dummy photodiode 12 generates only a current signal based on noise and the like. This current signal based on noise and the like can be assumed to be generated in the same manner as in the photodiode 10. The current signal based on noise and the like which is generated in the photodiode 12 is converted into a voltage signal in the dummy transimpedance amplifier 16. This voltage signal is raised by a voltage V1 by a voltage source V1 and inputted to the differential amplifier 20. An example of this voltage signal is S2 in FIG. 8A. Incidentally, the reason why an offset of the voltage V1 is provided is that the operation of the comparator 22 is stabilized by allowing the voltage signal S2 to have a higher voltage when the voltage signal S1 being an output of the transimpedance amplifier 14 is nothing.

The differential amplifier 20 amplifies a difference between these voltage signals S1 and S2 and outputs a equilibrium signal S3, and concurrently outputs a equilibrium signal S4 obtained by inverting the equilibrium signal S3. Respective examples of the equilibrium signals S3 and S4 are shown in FIG. 8B. These equilibrium signals S3 and S4 are inputted to the comparator 22. The equilibrium signals S3 and S4 are outputted to the output circuit 24 after their waveforms are adjusted in the comparator 22. The output circuit 24 outputs a digital signal based on the equilibrium signals S3 and S4.

The aforementioned optical signal receiving circuit 5, however, has a problem that when the operating region of the differential amplifier 20 is in a clip region, clip voltage is outputted to the equilibrium signals S3 and S4, and hence an accurate digital signal is not obtained. Namely, if the equilibrium signal S3 is taken as an example, when the differential amplifier 20 operates in a non-clip region as shown in FIG. 9, the equilibrium signal S3 can draw a correct waveform according to a photocurrent as shown by a full line. When the differential amplifier 20 operates in the clip region, however, the equilibrium signal S3 is clipped with the clip voltage of the differential amplifier 20 as shown by a dotted line, and hence it cannot draw a correct waveform according to the photocurrent. There arises a problem that if the digital signal is generated by use of such equilibrium signals S3 and S4, the pulse width of the digital signal increases.

Moreover, in the photodiode 10 and the transimpedance amplifier 14 which convert the optical signal into the current signal, a tail 40 such as shown in FIG. 8A is sometimes caused by a diffusion current in the photodiode or the like when the optical signal is about to disappear. If the tail 40 occurs in the voltage signal S1, the tail 40 is amplified by the differential amplifier 20, which causes a problem that the pulse width of the outputted digital signal is increased or a pulse combines with the next pulse. Namely, as shown in FIG. 8A, if the tail 40 occurs in the voltage signal S1, the cross point between the equilibrium signal S3 and the equilibrium signal S4 is shifted, and hence a distortion 42 occurs in the pulse width of the outputted digital signal.

SUMMARY OF THE INVENTION

In order to accomplish the aforementioned and other objects, according to one aspect of the present invention, an optical signal receiving circuit, comprises:

a first transimpedance amplifier configured to convert a first current signal into a first voltage signal, wherein the first current signal is generated in a first photodiode, to which an optical signal is inputted;

a reference voltage generating circuit configured to generate a second voltage signal which is independent of the first voltage signal and which is a signal of a reference voltage;

a level shift circuit configured to shift at least one of the first voltage signal and the second voltage signal in a close direction and output it, wherein the close direction is a direction in which the center voltage of the amplitude of the first voltage signal and the voltage of the second voltage signal get closer, wherein the amplitude of the first voltage signal is generated based on a result of detection of light of the optical signal in the first photodiode; and a differential amplifier to which the first voltage signal and the second voltage signal outputted from the level shift circuit are inputted, the differential amplifier configured to amplify a difference between the first voltage signal and the second voltage signal.

According to another aspect of the present invention, an optical signal receiving circuit, comprises:

a first transimpedance amplifier configured to convert a first current signal into a first voltage signal, wherein the first current signal is generated in a first photodiode, to which an optical signal is inputted;

a second transimpedance amplifier configured to convert a second current signal into a second voltage signal, wherein the second current signal is generated in a second photodiode, to which no optical signal is inputted;

a level shift circuit configured to shift at least one of the first voltage signal and the second voltage signal in a close direction and output it, wherein the close direction is a direction in which the center voltage of the amplitude of the first voltage signal and the voltage of the second voltage signal get closer, wherein the amplitude of the first voltage signal is generated based on a result of detection of light of the optical signal in the first photodiode; and a differential amplifier to which the first voltage signal and the second voltage signal outputted from the level shift circuit are inputted, the differential amplifier configured to amplify a difference between the first voltage signal and the second voltage signal.

According to a further aspect of the present invention, an optical signal receiving semiconductor device, comprises:

a first photodiode formed on a semiconductor chip, wherein an optical signal is inputted to the first photodiode so as to generate a first current signal;

a second photodiode formed on the semiconductor chip, wherein no optical signal is inputted to the second photodiode so as to generate a second current signal; and a optical signal receiving circuit, comprising:

a first transimpedance amplifier configured to convert the first current signal into a first voltage signal;

a second transimpedance amplifier configured to convert the second current signal into a second voltage signal;

a level shift circuit configured to shift at least one of the first voltage signal and the second voltage signal in a close direction and output it, wherein the close direction is a direction in which the center voltage of the amplitude of the first voltage signal and the voltage of the second voltage signal get closer, wherein the amplitude of the first voltage signal is generated based on a result of detection of light of the optical signal in the first photodiode; and a differential amplifier to which the first voltage signal and the second voltage signal outputted from the level shift circuit are inputted, the differential amplifier configured to amplify a difference between the first voltage signal and the second voltage signal.

DETAILED DESCRIPTION OF THE EMBODIMENTS (First Embodiment)

An optical signal receiving circuit according to the first embodiment is provided with a level shift circuit which sifts the voltage of a voltage signal based on an optical signal downward in a stage previous to a differential amplifier, and then an output signal is prevented from an influence of a tail. Further details will be given below.

Figure 1:
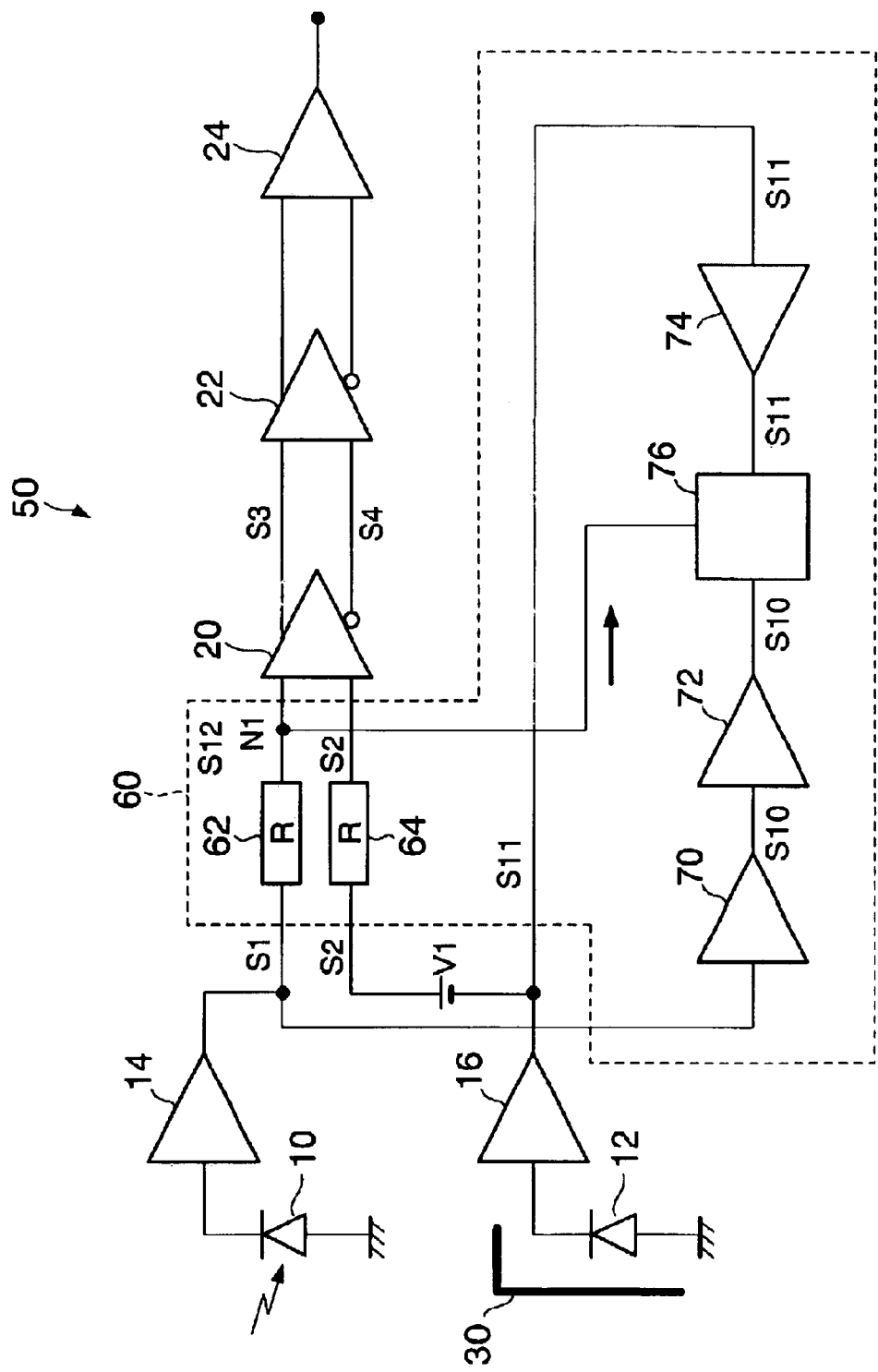
FIG. 1 is a block diagram explaining the circuit configuration of an optical signal receiving circuit according to a first embodiment.
Figure 2A:
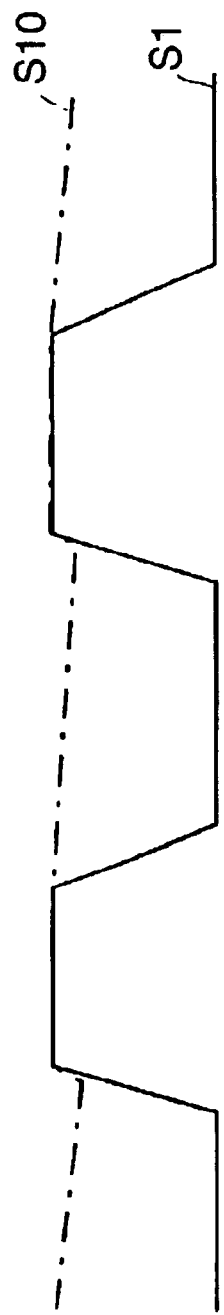
FIG. 2A, FIG. 2B, and FIG. 2C are diagrams showing voltage waveforms in various nodes of the optical signal receiving circuit in FIG. 1.
Figure 2B:
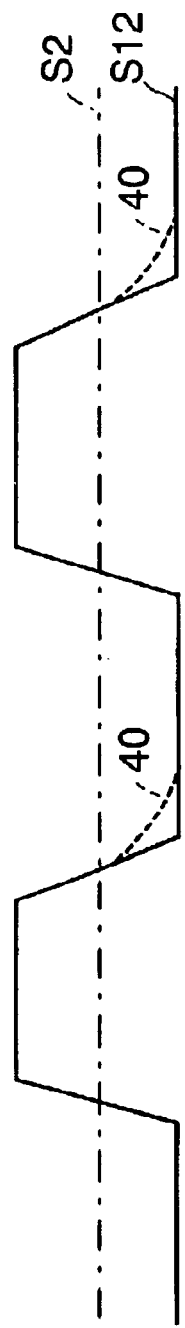
Figure 2C:
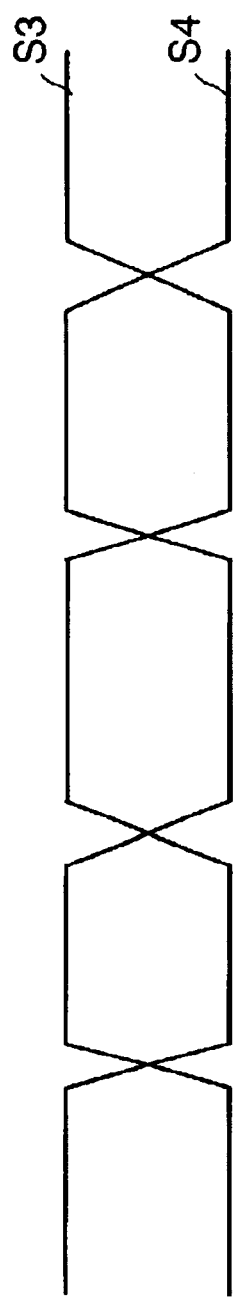

FIG. 1 is a block diagram explaining a circuit configuration of an optical signal receiving circuit 50 according to this embodiment, and FIG. 2 A, FIG. 2B, and FIG. 2C are diagrams showing voltage waveforms in various nodes of the optical signal receiving circuit 50.

Figure 7:
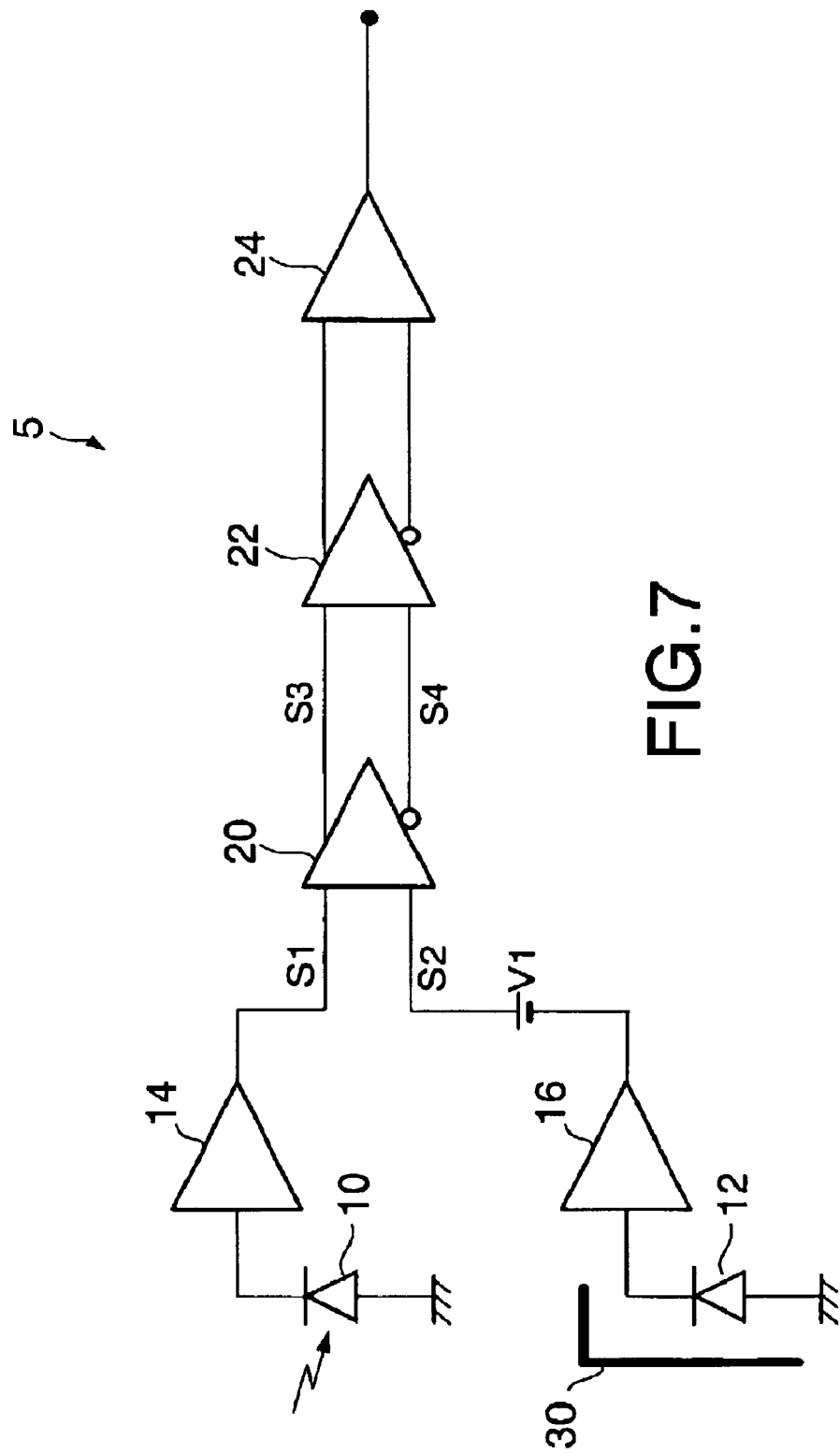
FIG. 7 is a block diagram explaining the circuit configuration of a related optical signal receiving circuit.
Figure 8:
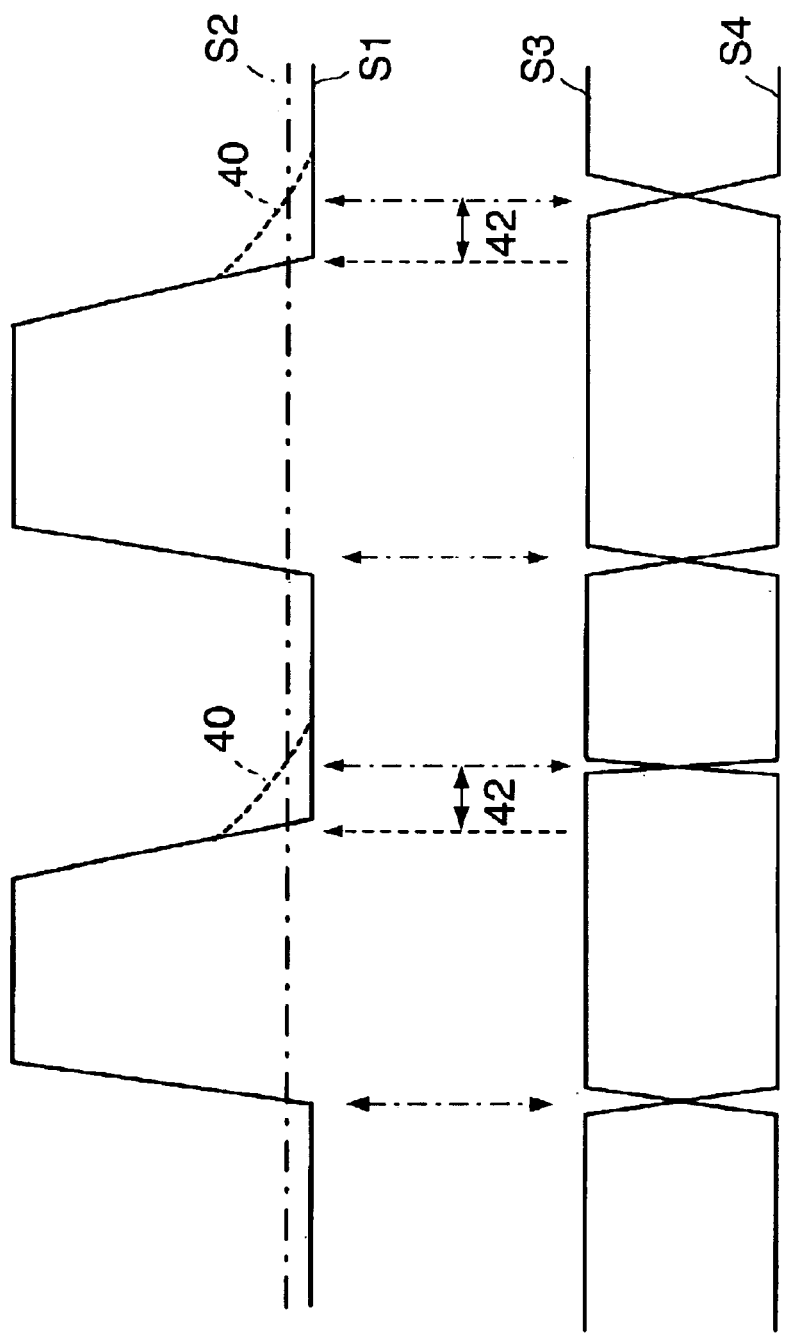
FIG. 8A and FIG. 8B are diagrams showing voltage waveforms in various nodes of the optical signal receiving circuit in FIG. 7.
Figure 9:
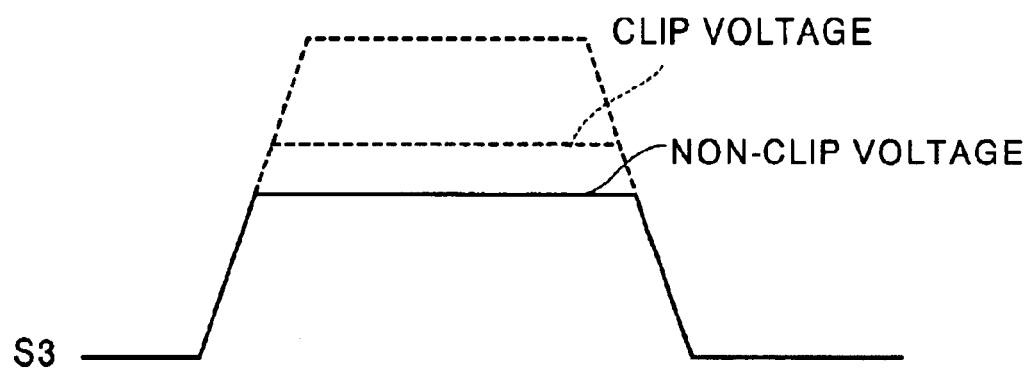
FIG. 9 is a diagram showing a voltage waveform when a voltage signal being an output of a differential amplifier is clipped and a voltage waveform when it is not clipped.

As shown in FIG. 1, the optical signal receiving circuit 50 according to this embodiment is configured by additionally inserting a level shift circuit 60 in a stage previous to a differential amplifier 20 in an optical signal receiving circuit 5 described above. It should be noted that the same numerals and symbols are used to designate the same components as those in the aforementioned optical signal receiving circuit 5 in FIG. 7. Moreover, in this embodiment, respective elements and respective circuits shown in FIG. 1 are formed on one semiconductor chip to constitute part of an optical signal receiving semiconductor device.

The level shift circuit 60 according to this embodiment includes resistances 62 and 64, a peak hold circuit 70, buffer circuits 72 and 74, and an operational circuit 76. An output of a transimpedance amplifier 14 is connected to one end of the resistance 62 and the peak hold circuit 70, and the other end of the resistance 62 is connected to an input of the differential amplifier 20.

The peak hold circuit 70 is a circuit which holds a peak value of a voltage signal S1 being an output of the transimpedance amplifier 14 for a predetermined time. Namely, as shown in FIG. 2A, the voltage signal S1 is inputted to the peak hold circuit 70, and a voltage signal S10 which is obtained by maintaining the peak value of the voltage signal S1 for the predetermined time is outputted therefrom. The voltage signal S10 is inputted to the buffer circuit 72. The voltage signal S10 outputted from the buffer circuit 72 is inputted to the operational circuit 76.

On the other hand, an output of a dummy transimpedance amplifier 16 is connected to a voltage source V1 and an input of the buffer circuit 74. Accordingly, a voltage signal S11 outputted from the transimpedance amplifier 16 is inputted to the operational circuit 76 via the buffer circuit 74.

The resistance 64 is inserted between the voltage source V1 and an input of the differential amplifier 20. In this embodiment, the resistance value of the resistance 64 is substantially the same as the resistance value of the resistance 62. In other words, the resistance 64 is provided to equalize the resistance value on the input side of the differential amplifier 20 with the resistance value on the resistance 62 side. Therefore, the resistance 64 is an element which is not necessarily required in this embodiment. A node N1 between the resistance 62 and the input of the differential amplifier 20 is connected to the operational circuit 76.

In this embodiment, the operational circuit 76 is a circuit which shifts the voltage at the node N1 downward by half of the peak amplitude of the voltage signal S1. Namely, when the voltage signal S11 such as shown in FIG. 2A is generated, a voltage signal S12 at the node N1 has a waveform shifted downward by half of the peak amplitude as shown in FIG. 2B.

Accordingly, in this embodiment, the voltage signal S12 whose voltage is shifted downward as described above is inputted to the differential amplifier 20. On the other hand, the voltage signal S11 from the transimpedance amplifier 16 is offset by the voltage V1 and inputted to the differential amplifier 20 via the resistance 64. Therefore, even if a tail 40 such as shown in FIG. 2B is caused to the voltage signal S12, it is possible to prevent the influence of the tail 40 upon the equilibrium signals S3 and S4 as shown in FIG. 2C.

Figure 3:
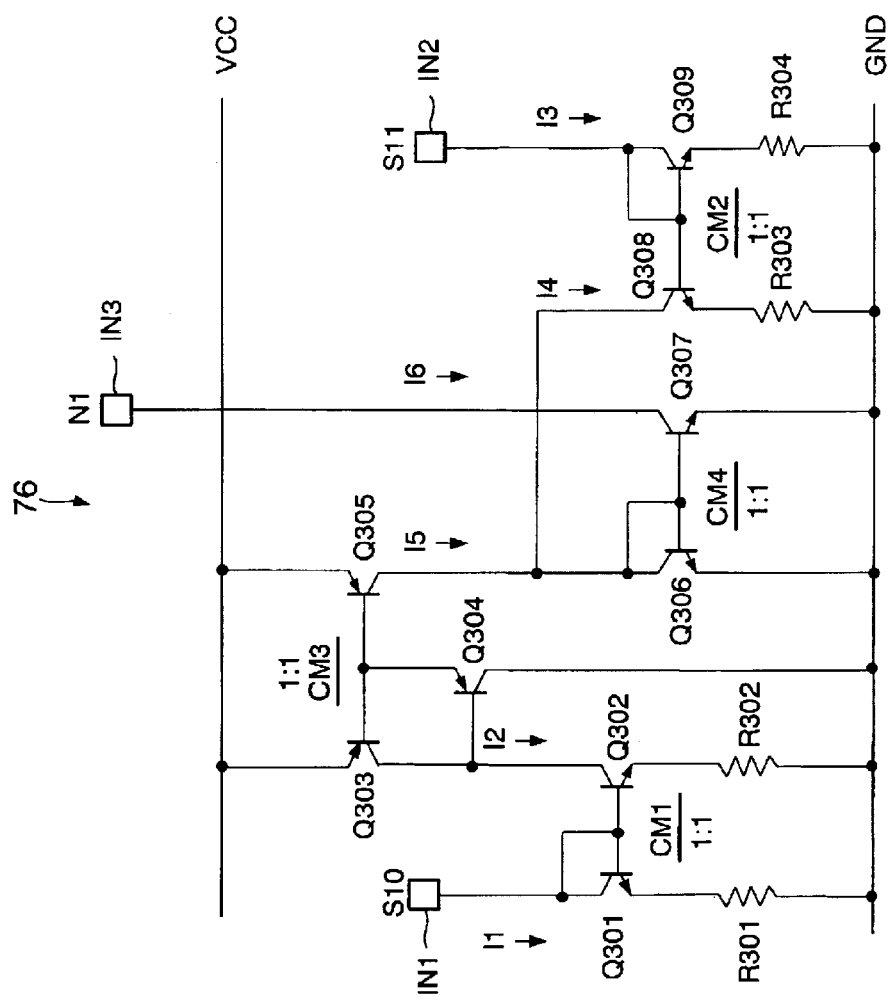
FIG. 3 is a circuit diagram showing the configuration of an operational circuit of the optical signal receiving circuit according to the first embodiment.

FIG. 3 is a diagram showing an example of a circuit configuration of the operational circuit 76 according to this embodiment. As shown in FIG. 3, the operational circuit 76 includes resistances R301 to R304, NPN-type bipolar transistors Q301, Q302, and Q306 to Q309, and PNP-type bipolar transistors Q303 to Q305.

More specifically, the voltage signal S10 from the buffer circuit 72 is inputted to an input terminal IN1, and the voltage signal S11 from the buffer circuit 74 is inputted to an input terminal IN2. The voltage signal S10 is converted into a current I1 by the resistance R301, and the voltage signal S11 is converted into a current I3 by the resistance R304. The current I1 is mirrored by a first current mirror circuit CM1 composed of the transistors Q301 and Q302 and outputted as a current I2. The current I3 is mirrored by a second current mirror circuit CM2 composed of the transistors Q308 and Q309 and outputted as a current I4.

The current I2 is mirrored by a third current mirror circuit CM3 composed of the transistors Q303, Q304, and Q305 and becomes a current I5. The current I5 is inputted to a fourth current mirror circuit CM4 composed of the transistors Q306 and Q307, and simultaneously the output current I4 of the second current mirror circuit CM2 is also connected to the same node, whereby an output current I6 of the fourth current mirror circuit CM4 is expressed by the following equation.

$$I6=I5-I4=I1-I3 \qquad (1)$$

The mirror ratios of the aforementioned current mirror circuits CM1 to CM4 are all 1:1. Moreover, the voltage at the input terminal IN1 is the voltage of the peak value of the voltage signal S1, while the voltage at the input terminal IN2 is the voltage of the voltage signal S11 used as the reference, and hence the current I6, which is a difference between their corresponding currents I1 and I3, is a current corresponding to the amplitude of the voltage signal S1.

Consequently, for example, by designing the resistance 62 in FIG. 1 to have half of the value of the resistance R301, designing the resistance R304 to have the same value as the resistance R301, connecting an output terminal IN3 to the node N1, and extracting the current I6 from the node N1, the voltage at the node N1 drops by half of the pulse peak value (amplitude) of the voltage signal S1 as shown in FIG. 2B. Therefore, a voltage signal S2 which is a reference voltage is located almost in the center of the signal pulse amplitude of the voltage signal S12. Thereby, the equilibrium signals S3 and S4 faithful to an inputted optical signal can be outputted. In this case, even if a tail 40 due to a diffusion current in a photodiode 12 or the like is caused to each of the voltage signals SI and S12, this tail 40 is located on the lower voltage side than the voltage signal S2 being the reference voltage, which can avoid its influence upon the equilibrium signals S3 and S4. This can prevent the occurrence of pulse width distortion in a digital signal which is an output signal of this optical signal receiving circuit 50.

Figure 4:
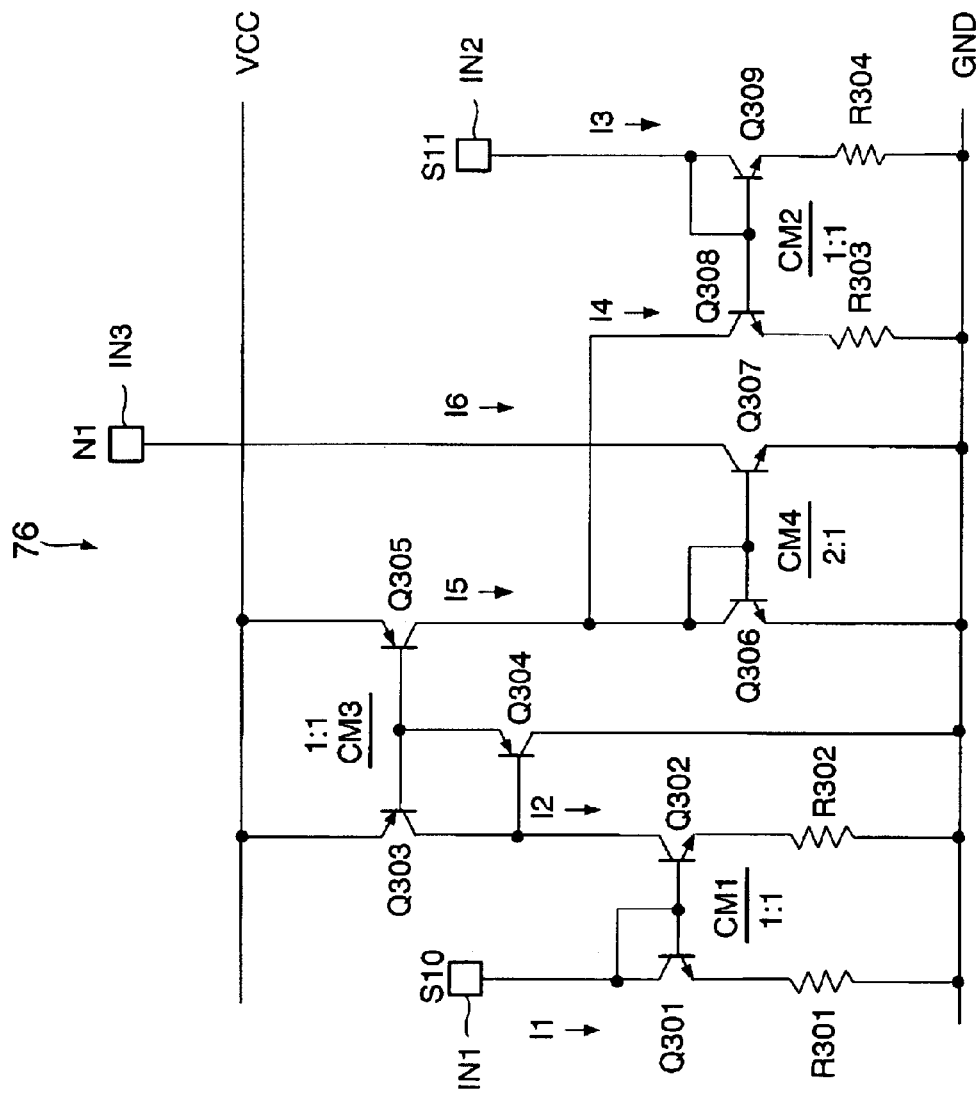
FIG. 4 is a diagram showing a modification of the operational circuit in FIG. 3.

Incidentally, in the operational circuit 76 in FIG. 3, the resistance 62 in FIG. 1 is designed to have half of the value of the resistance R301 and the voltage at the node N1 drops by half the amplitude of the voltage signal Si, but for example, as shown in FIG. 4, it is also possible that the current I6 has half of the value of the current I1–I3 by designing the emitter size of the transistor Q306 to be double the emitter size of the transistor Q307 with the resistance 62 having substantially the same value as the resistance R301. In other words, if the resistance 62=the resistance R301, the mirror ratio of the fourth current mirror circuit CM4 may be 2:1.

As described above, according to the optical signal receiving circuit 50 according to this embodiment, the voltage signal S1 is shifted by almost half of its amplitude in an opposite direction to an oscillation direction which is the direction of change when the optical signal is detected by the photodiode 10 and becomes the voltage signal S12, hence the voltage signal S2 as the reference voltage is located in the central position of the amplitude of the voltage signal S12, and consequently, even if the differential amplifier 20 in the next stage performs a clip operation, it is possible to cross the equilibrium signals S3 and S4 in the center of the amplitude as shown in FIG. 2C, which can avoid its influence upon the output signal of the optical signal receiving circuit 50. Moreover, even if the tail 40 occurs in the voltage signal S1, this tail 40 is a voltage lower than the voltage of the voltage signal S2 as the reference voltage, whereby the influence of the tail 40 upon the operation of the differential amplifier 20 can be avoided. As a result, the possibility of occurrence of pulse width distortion in the digital signal as the output of the optical signal receiving circuit 50 can be reduced greatly.

The resistance 62 is provided between the output of the transimpedance amplifier 14 and the input of the differential amplifier 20, the resistance 64 is provided between the output of the transimpedance amplifier 16 and the input of the differential amplifier 20, and the resistance value of this resistance 64 is made substantially the same as that of the resistance 62. Consequently, an error due to an input bias current of the differential amplifier 20, or the like can be reduced.

Moreover, since the buffer circuit 74 is provided between the output of the transimpedance amplifier 16 and the operational circuit 76, an error due to a load current can be reduced by lightening the output load of the transimpedance amplifier 16. Further, since the buffer circuit 72 is provided between the peak hold circuit 70 and the operational circuit 76, it is possible to light the load of the peak hold circuit 70 to thereby prolong the voltage hold time of the peak hold circuit 70 and hold the error due to the load current to a minimum.

Furthermore, in this embodiment, since the operational circuit 76 performs an operation after once converting a voltage signal into a current, it can be configured more simply than when the operation is performed with a voltage itself. Moreover, since the output of the operational circuit 76 has high impedance, the voltage at the node N1 can be controlled while hardly affecting the original operation of the differential amplifier 20.

(Second Embodiment)

In the second embodiment, a modification is added to the circuit configuration of the operational circuit 76 according to the aforementioned first embodiment. In this embodiment, the entire configuration of the optical signal receiving circuit 50 is the same as that in FIG. 1 described above.

Figure 5:
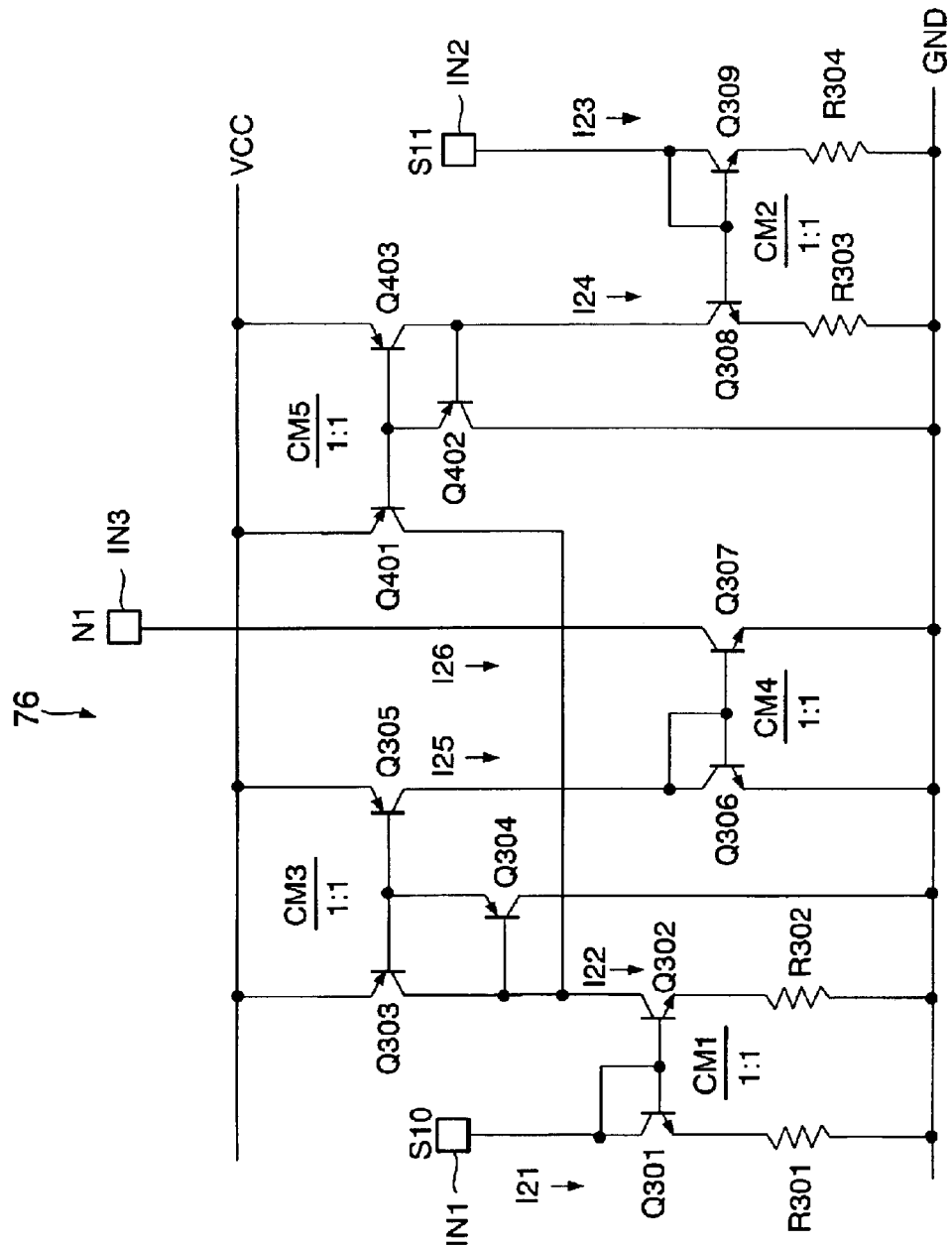
FIG. 5 is a circuit diagram showing the configuration of an operational circuit of an optical signal receiving circuit according to a second embodiment.

FIG. 5 is a diagram showing the circuit configuration of the operational circuit 76 according to the second embodiment. As shown in FIG. 5, the operational circuit 76 according to this embodiment is configured by adding a fifth current mirror circuit CM5 to the operational circuit in FIG. 3. This fifth current mirror circuit CM5 is composed of PNP-type bipolar transistors Q401 to Q403, and its mirror ratio is 1:1.

The operational circuit 76 shown in FIG. 5 also operates in the same manner as the operational circuit 76 shown in FIG. 3. Namely, a current I26 is expressed by the following equation.

$$I26=I25=I22-I24=I21-I23 \quad (2)$$

In other words, the voltage signal S10 inputted from the input terminal IN1 is converted into a current I21 by the resistance R301. This current I21 is mirrored by the first current mirror circuit CM1 and outputted as a current I22.

On the other hand, the voltage signal S11 inputted from the input terminal IN2 is converted into a current I23 by the resistance R304. This current I23 is mirrored by the second current mirror circuit CM2 and outputted as a current I24. This current I24 is mirrored by the fifth current mirror circuit CM5 and flows into the output side of the first current mirror circuit CM1.

Accordingly, in the third current mirror circuit CM3, the current I22–I24 is mirrored and outputted as a current I25. This current I25 is mirrored by the fourth current mirror circuit CM4 and becomes a current I26. Hence, the current I26 becomes the current I21–I23 which is a current corresponding to the pulse amplitude of the voltage signal S1.

Figure 6:
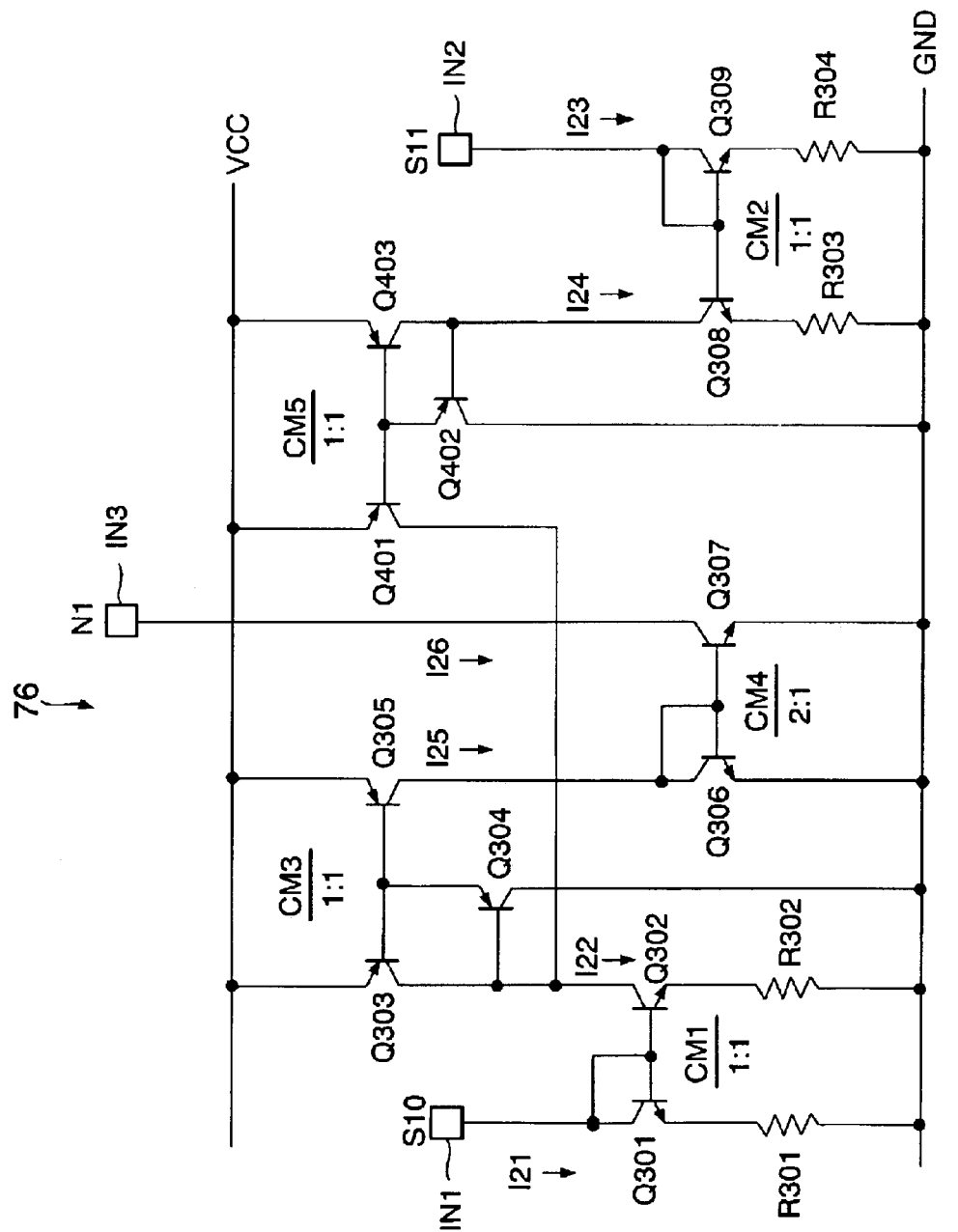
FIG. 6 is a diagram showing a modification of the operational circuit in FIG. 5.

Consequently, if the value of the resistance 62 is designed to be half the value of the resistance R301 as in the aforementioned first embodiment, the voltage signal S12 such as shown in FIG. 2B can be obtained at the node N1. Moreover, similarly to the aforementioned first embodiment, it is suitable to equalize the resistance value of the resistance 62 and the resistance value of the resistance R301 and make the mirror ratio of the fourth current mirror circuit CM4 2:1 as shown in FIG. 6.

Incidentally, the present invention is not limited to the aforementioned embodiments, and various modifications may be made therein. For example, resistance values and the mirror ratios of the current mirror circuits in the operational circuit 76 are not limited to the aforementioned combination. Namely, a combination has only to be determined so that the voltage at the node N1 is half the amplitude of the voltage signal S1. In other words, the voltage of the voltage signal S1 has only to be shifted so that the voltage signal S2 is located in a central position of the amplitude of the voltage signal S12.

The pulse width distortion of the outputted digital signal becomes a minimum when the voltage signal S2 is located in the center of the amplitude of the voltage signal S12, but no problem arises even if it is not necessarily exactly in the center. Namely, in terms of practical use, it is sufficient if the voltage signal S2 is located in the central position of the amplitude of the voltage signal S12.

Moreover, even if the NPN transistors and the PNP transistors in the aforementioned operational circuit 76 are interchanged, the same operation can be realized. Further, although the aforementioned operational circuit 76 is composed of the bipolar-type transistors, it can be composed of MIS transistors (Metal-Insulator-Semiconductor Transistors).

Moreover, although the transimpedance amplifiers 14 and 16 are provided separately in the aforementioned embodiments, it is also possible to integrate them and use a differential amplifier. Incidentally, the buffer circuits 72 and 74 are general circuits and can be realized, for example, by a voltage follower circuit to which the differential amplifier is applied.

Figure 10:
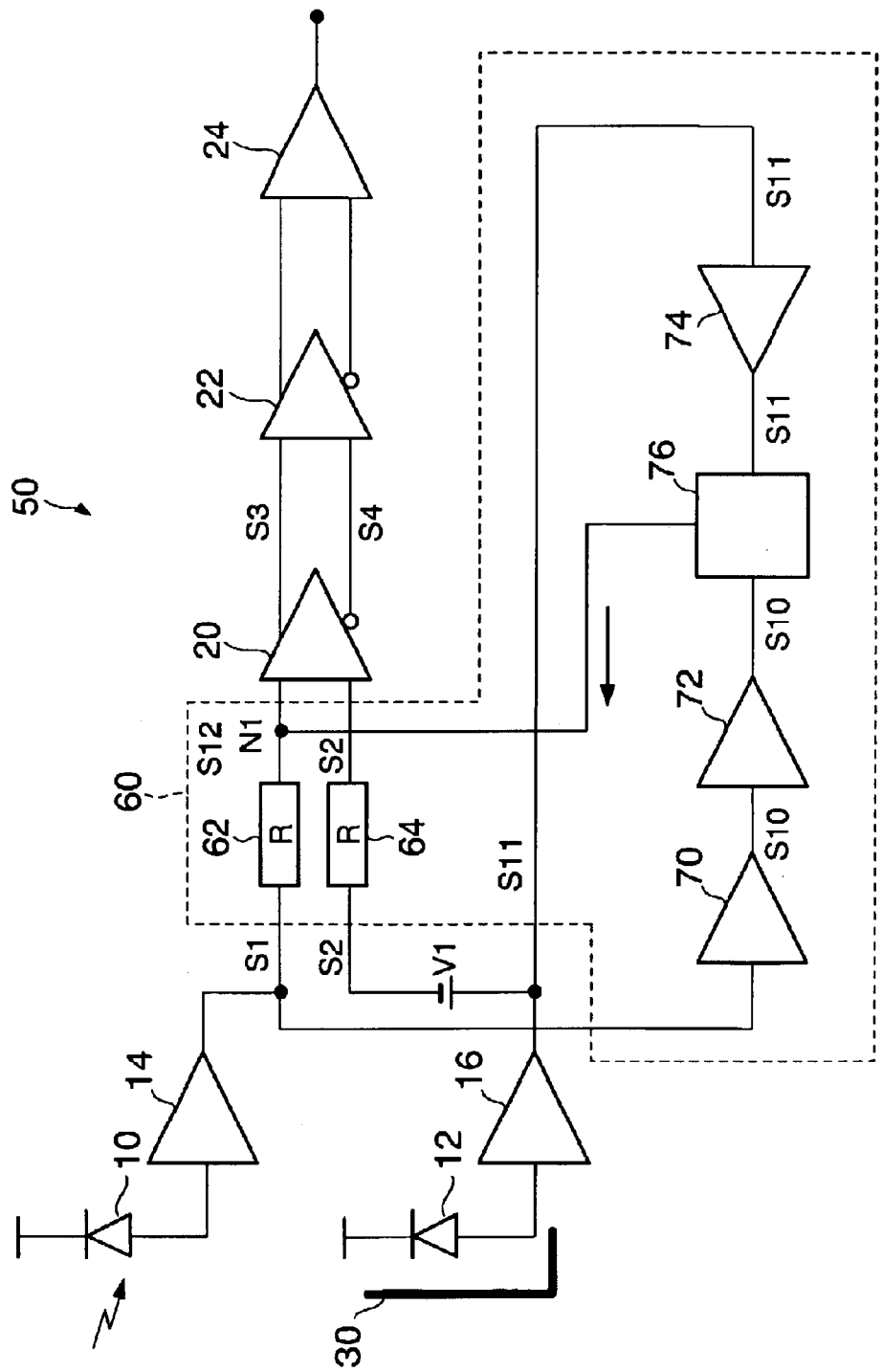
FIG. 10 is a block diagram explaining the circuit configuration of an optical signal receiving circuit in which a voltage signal which is an output of a transimpedance amplifier drops when a photodiode detects light of an optical signal by modifying the optical signal receiving circuit in FIG. 1.

Further, although the present invention is explained with the optical signal receiving circuit in which the voltage of the voltage signal S1 rises when the photodiode 10 detects light of an optical signal as an example in the aforementioned embodiments, as shown in FIG. 10, the present invention is also applicable to an optical signal receiving circuit in which the voltage of the voltage signal S1 drops when the photodiode 10 detects the light of the optical signal. Namely, in this case, it can be said that the level shift circuit 60 is a circuit which shifts the voltage of the voltage signal S1 in an opposite direction to an oscillation direction which is the direction of change of the voltage signal S1 when the light of the optical signal is detected by the photodiode 10. In the case of the optical signal receiving circuit in FIG. 10, the level shift circuit 60 feeds a current to the node N1 in order to raise the voltage at the node N1.

Figure 11:
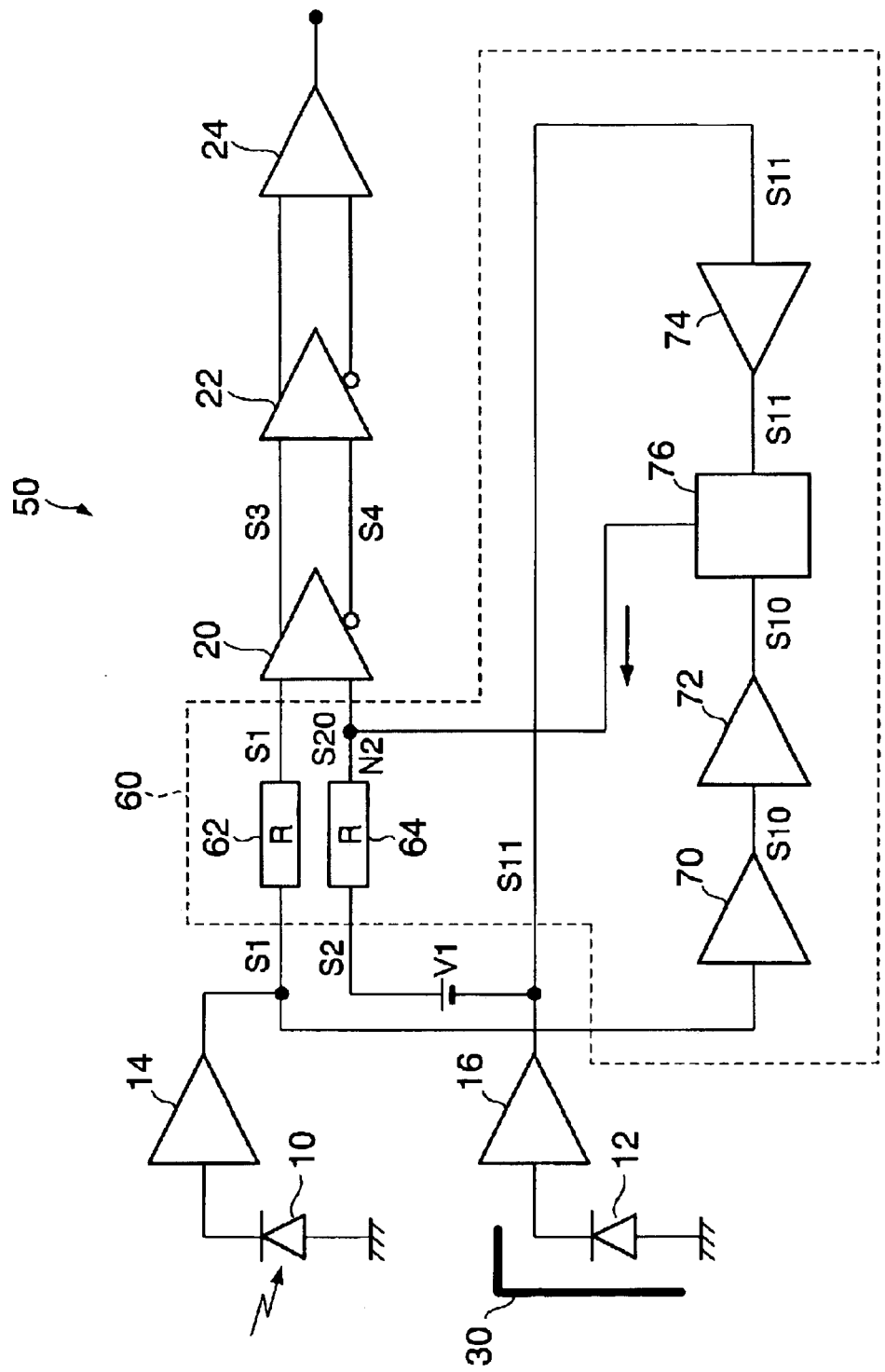
FIG. 11 is a block diagram explaining the circuit configuration of an optical signal receiving circuit when a level shift circuit controls the voltage of a voltage signal which is a reference voltage.
Figure 12A:
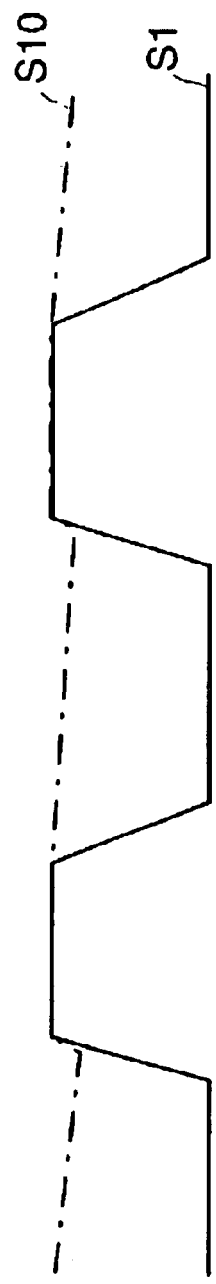
FIG. 12A, FIG. 12B, and FIG. 12C are diagrams showing voltage waveforms in various nodes of the optical signal receiving circuit in FIG. 11.
Figure 12B:
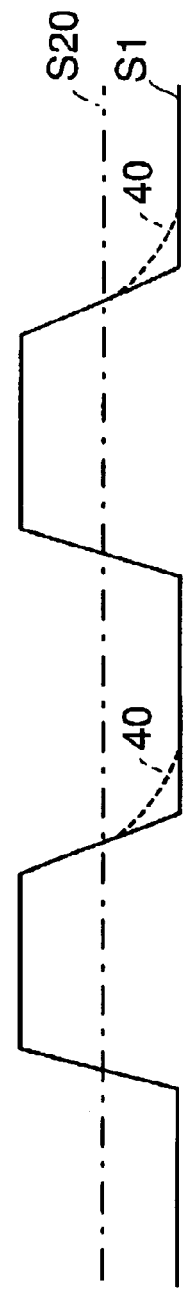
Figure 12C:
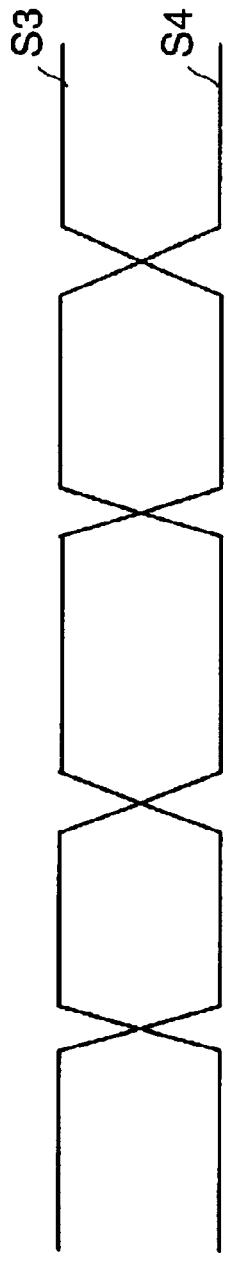

Furthermore, as shown in FIG. 11, it is also suitable to shift the voltage signal S2 as the reference voltage in the oscillation direction which is the direction of change of the voltage signal S1 when the light of the optical signal is detected by the photodiode 10. Namely, in the case of FIG. 11, when the photodiode 10 detects the light of the optical signal, as shown in FIG. 12A, the voltage signal S1 rises. Therefore, the level shift circuit 60 in FIG. 11 feeds a current to a node N2 between the resistance 64 and the differential amplifier 20, whereby as shown in FIG. 12B, the voltage signal S2 is raised to become the voltage signal S20, so that the voltage signal S20 is located in the central position of the amplitude of the voltage signal S1. In so doing, similarly to the aforementioned first and second embodiments, pulse width distortion which occurs in the output signal can be reduced.

Figure 13:
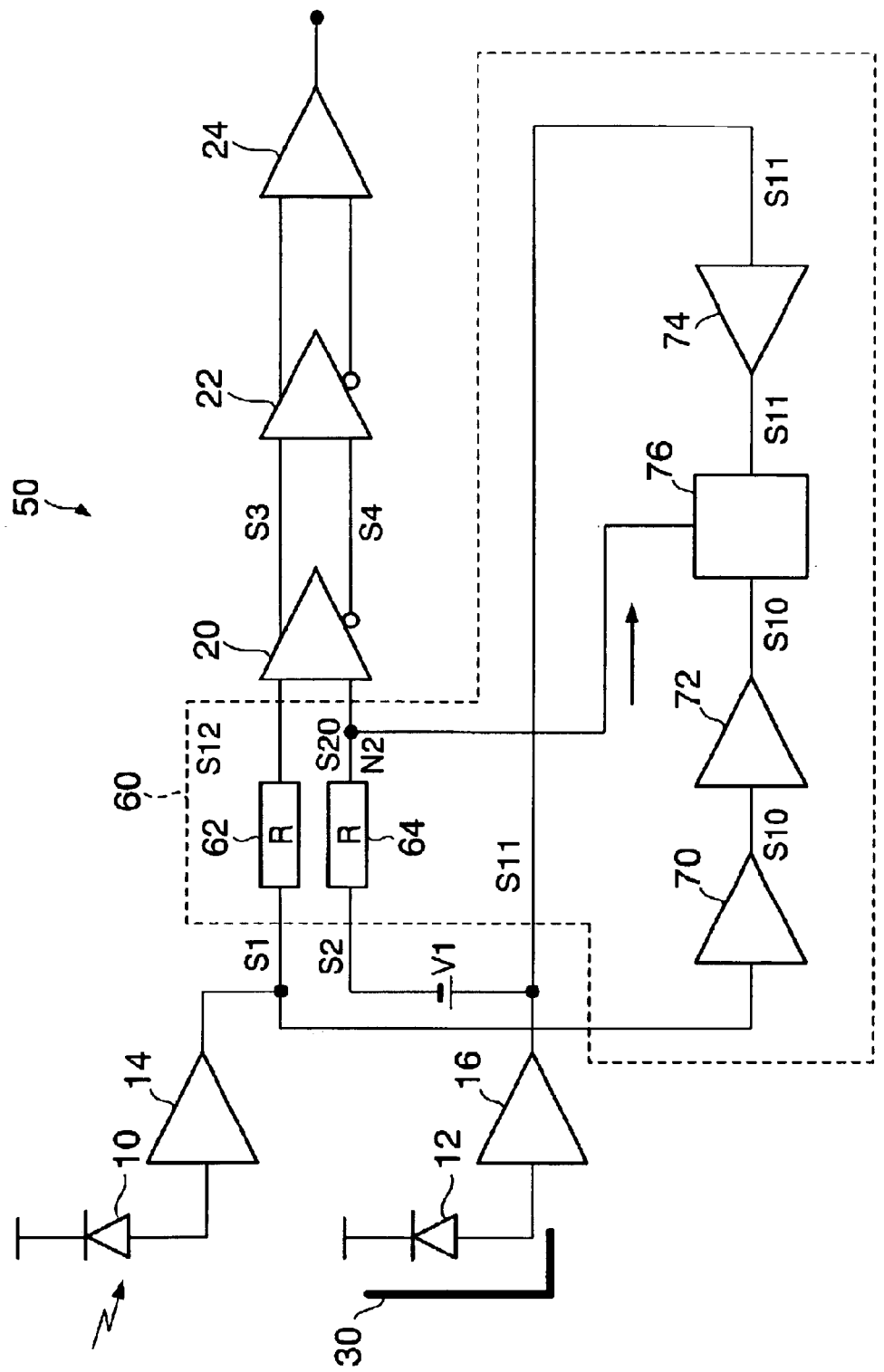
FIG. 13 is a block diagram explaining the circuit configuration of an optical signal receiving circuit in which a voltage signal which is an output of a transimpedance amplifier drops when a photodiode detects light of an optical signal by modifying the optical signal receiving circuit in FIG. 11.

Moreover, by modifying the optical signal receiving circuit shown in FIG. 11, as shown in FIG. 13, the present invention can be applied to an optical signal receiving circuit in which the voltage of the voltage signal S1 drops when the photodiode 10 detects the light of the optical signal.

Figure 14:
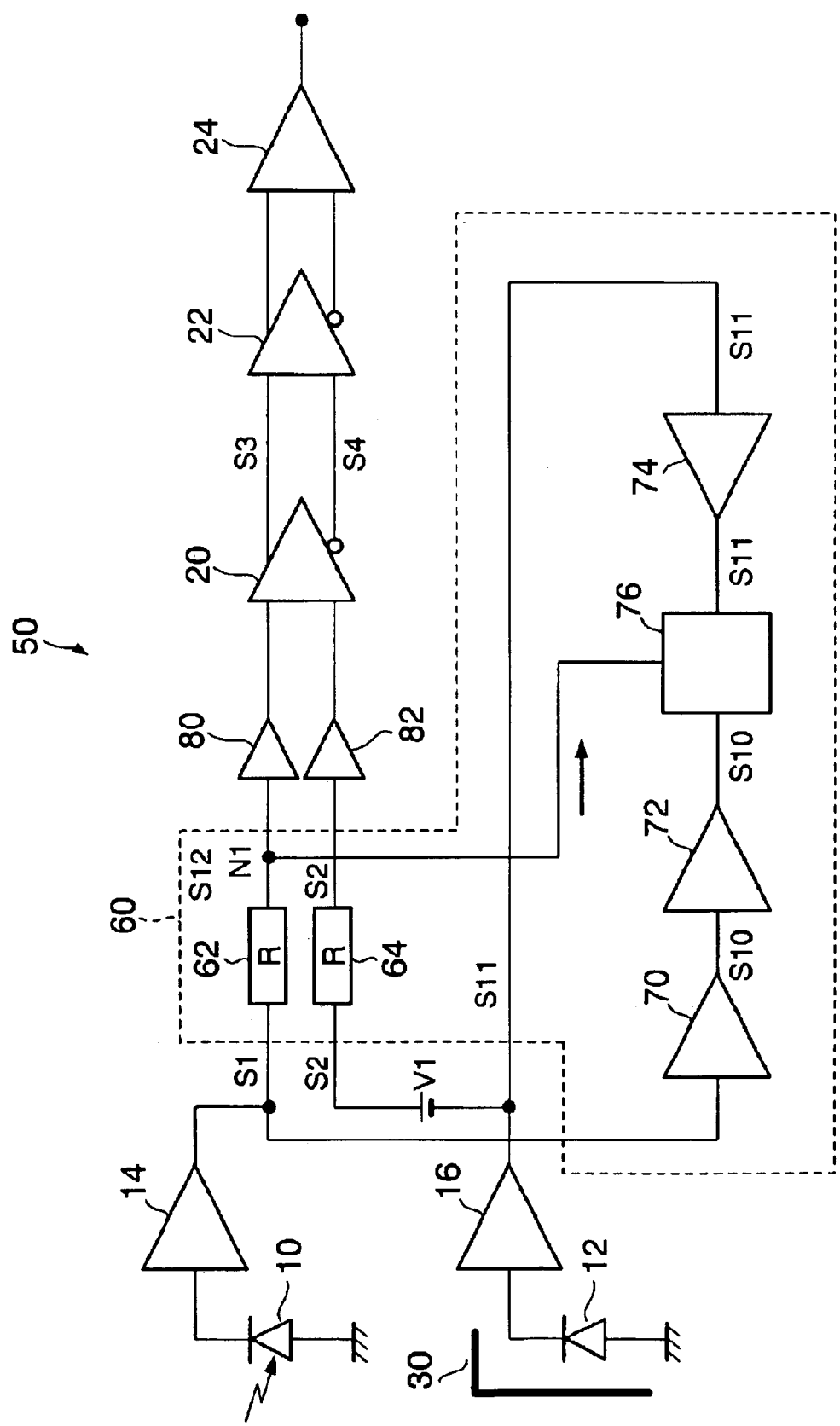
FIG. 14 is a block diagram explaining an example of the circuit configuration of an optical signal receiving circuit in which an output of a level shift circuit is inputted to a differential amplifier via a buffer as an example of another circuit.

Besides, the aforementioned resistances 62 and 64 need not be necessarily connected directly to the inputs of the differential amplifier 20. For example, as shown in FIG. 14, they may be inputted to the differential amplifier 20 via buffers (emitter followers, or the like) 80 and 82. In the case of the example in FIG. 14, the voltage signal S12 is inputted to the differential amplifier 20 via the buffer 80, and the voltage signal S2 is inputted to the differential amplifier 20 via the buffer 82. In other words, the voltage signals outputted from the level shift circuit may be each indirectly inputted to the differential amplifier 20 via another circuit. This also applies to the other optical signal receiving circuits (for example, in FIG. 10, FIG. 11, and FIG. 13).

Figure 15:
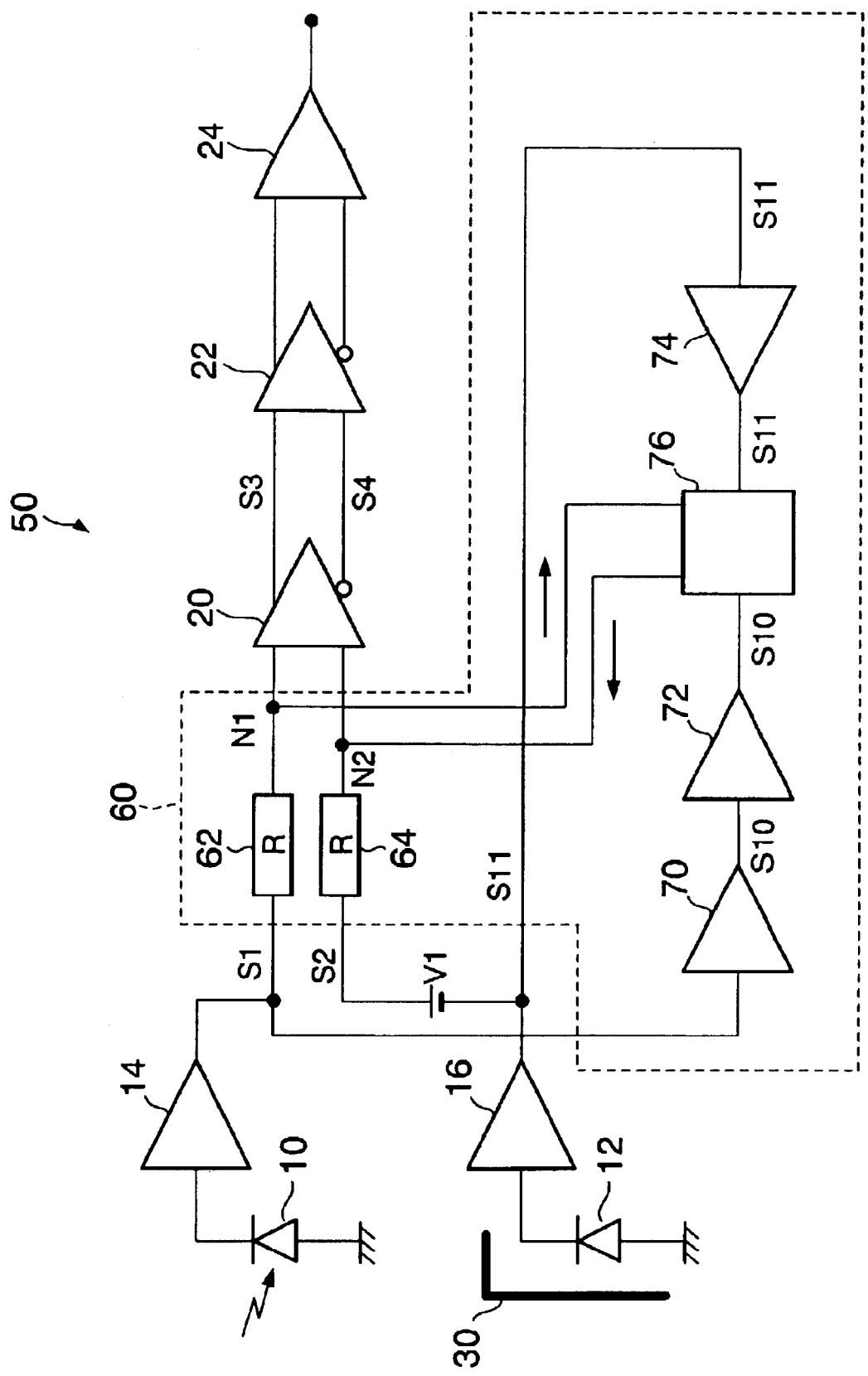
FIG. 15 is a block diagram explaining the circuit configuration of an optical signal receiving circuit when a level shift circuit controls both of the voltage of a voltage signal (whose voltage rises when light is detected) which is amplified by an optical signal and the voltage of a voltage signal as a reference voltage.
Figure 16:
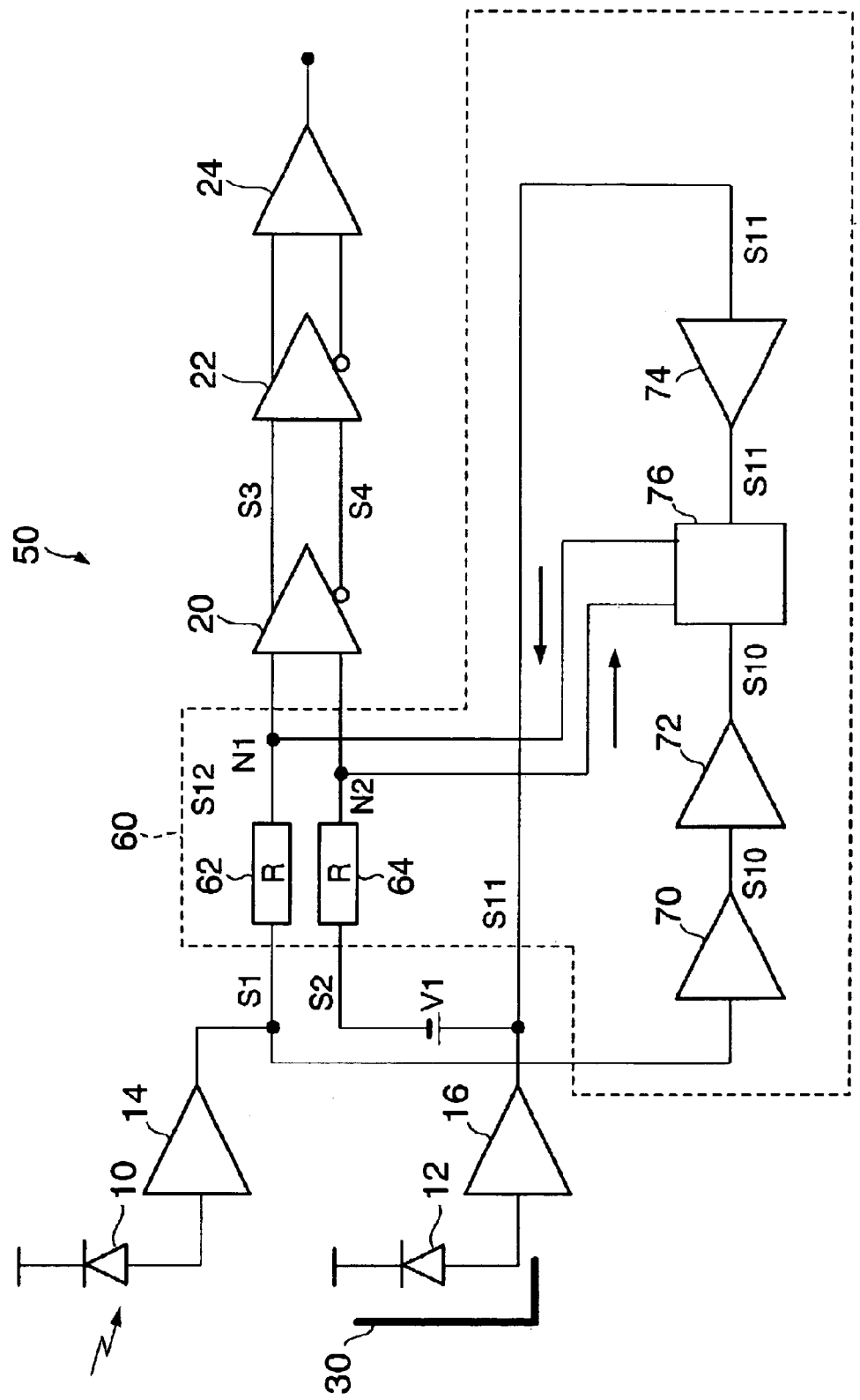
FIG. 16 is a block diagram explaining the circuit configuration of an optical signal receiving circuit when a level shift circuit controls both of the voltage of a voltage signal (whose voltage drops when light is detected) which is amplified by an optical signal and the voltage of a voltage signal as a reference voltage.

Moreover, although the voltage of the voltage signal S1 or the voltage signal S2 is shifted in each of the level shift circuits 60 of the aforementioned optical signal receiving circuits, the voltages of both the voltage signal S1 and the voltage signal S2 may be shifted. In this case, as shown in FIG. 15, the level shift circuit 60 extracts a current according to a difference between the voltage signal S10 and the voltage signal S11 from the node N1 and feeds a current according to the difference between the voltage signal S10 and the voltage signal S11 to the node N2 so that the voltage signal S2 is located in the central position of the amplitude of the voltage signal S1. Further, as shown in FIG. 16, when the oscillation direction of the voltage signal S11 is opposite to the above, the level shift circuit 60 feeds a current according to the difference between the voltage signal S11 and the voltage signal S11 to the node N1 and extracts a current according to the difference between the voltage signal S10 and the voltage signal S11 from the node N2 so that the voltage signal S2 is located in the central position of the amplitude of the voltage signal S1. Namely, in the present invention, the level shift circuit 60 is required to shift the voltage of at least one of the voltage signal S1 and the voltage signal S2 in a direction in which the center voltage of the amplitude of the voltage signal S1 generated based on the result of detection of the light of the optical signal by the photodiode 10 and the voltage signal S2 as the reference voltage get closer.

Furthermore, the aforementioned photodiode 12 and the transimpedance amplifier 16 are an example of a reference voltage generating circuit to generate the voltage signal S11 which is the signal of a reference voltage, and the configuration of the reference voltage generating circuit is not limited to this. For example, it is also possible to provide an electrode in place of the photodiode 12 and input a signal of the electrode to the transimpedance amplifier 16.

What is claimed is:

1. An optical signal receiving circuit, comprising:
a first transimpedance amplifier configured to convert a first current signal into a first voltage signal, wherein the first current signal is generated in a first photodiode, to which an optical signal is inputted;
a reference voltage generating circuit configured to generate a second voltage signal which is independent of the first voltage signal and which is a signal of a reference voltage;
a level shift circuit configured to shift at least one of the first voltage signal and the second voltage signal in a close direction and output it, wherein the close direction is a direction in which the center voltage of the amplitude of the first voltage signal and the voltage of the second voltage signal get closer, wherein the amplitude of the first voltage signal is generated based on a result of detection of light of the optical signal in the first photodiode; and
a differential amplifier to which the first voltage signal and the second voltage signal outputted from the level shift circuit are inputted, the differential amplifier configured to amplify a difference between the first voltage signal and the second voltage signal.

2. The optical signal receiving circuit according to claim 1, wherein the level shift circuit shifts the voltage of the first voltage signal in an opposite direction to an oscillation direction which is the direction of change of the first voltage signal when the light of the optical signal is detected by the first photodiode.

3. The optical signal receiving circuit according to claim 2, wherein the level shift circuit comprises:
a first resistance which is provided between an output of the first transimpedance amplifier and an input of the differential amplifier; and
an operational circuit configured to extract a current from anode between the first resistance and the input of the differential amplifier or feed a current to the node between the first resistance and the input of the differential amplifier.

4. The optical signal receiving circuit according to claim 3, wherein the level shift circuit further comprises a second resistance which is provided between an output of the reference voltage generating circuit and an input of the differential amplifier and which has substantially the same resistance value as the first resistance.

5. The optical signal receiving circuit according to claim 4, wherein the level shift circuit further comprises a peak hold circuit configured to hold a peak value of the first voltage signal, which is an output of the first transimpedance amplifier, as a peak value voltage for a predetermined time,
the peak value voltage which is an output of the peak hold circuit and the second voltage signal which is an output of the reference voltage generating circuit are inputted to the operational circuit, and
the operational circuit extracts the current from the node between the first resistance and the input of the differential amplifier according to a difference between the peak value voltage and the voltage of the second voltage signal or the operational circuit feeds the current to the node between the first resistance and the input of the differential amplifier according to a difference between the peak value voltage and the voltage of the second voltage signal.

6. The optical signal receiving circuit according to claim 1, wherein the level shift circuit shifts the voltage of the second voltage signal in an oscillation direction which is the direction of change of the first voltage signal when the light of the optical signal is detected by the first photodiode.

7. The optical signal receiving circuit according to claim 6, wherein the level shift circuit comprises:
a third resistance which is provided between an output of the reference voltage generating circuit and an input of the differential amplifier; and
an operational circuit configured to extract a current from a node between the third resistance and the input of the differential amplifier or feed a current to the node between the third resistance and the input of the differential amplifier.

8. The optical signal receiving circuit according to claim 7, wherein the level shift circuit further comprises a fourth resistance which is provided between an output of the first transimpedance amplifier and an input of the differential amplifier and which has substantially the same resistance value as the third resistance.

9. The optical signal receiving circuit according to claim 8, wherein the level shift circuit further comprises a peak hold circuit configured to hold a peak value of the first voltage signal, which is an output of the first transimpedance amplifier, as a peak value voltage for a predetermined time, the peak value voltage which is an output of the peak hold circuit and the second voltage signal which is an output of the reference voltage generating circuit are inputted to the operational circuit, the operational circuit extracts the current from the node between the third resistance and the input of the differential amplifier according to a difference between the peak value voltage and the voltage of the second voltage signal or the operational circuit feeds the current to the node between the third resistance and the input of the differential amplifier according to a difference between the peak value voltage and the voltage of the second voltage signal.

10. The optical signal receiving circuit according to claim 1, wherein the level shift circuit shifts at least one of the first voltage signal and the second voltage signal so that the second voltage signal is located in a central position of the amplitude of the first voltage signal.

11. The optical signal receiving circuit according to claim 1, wherein the output of the level shift circuit is directly inputted to the differential amplifier not via another circuit.

12. The optical signal receiving circuit according to claim 1, wherein the output of the level shift circuit is indirectly inputted to the differential amplifier via another circuit.

13. The optical signal receiving circuit according to claim 1, wherein the reference voltage generating circuit comprises a second transimpedance amplifier configured to convert a second current signal into the second voltage signal, wherein the second current signal is generated in a second photodiode, to which no optical signal is inputted.

14. An optical signal receiving circuit, comprising:
a first transimpedance amplifier configured to convert a first current signal into a first voltage signal, wherein the first current signal is generated in a first photodiode, to which an optical signal is inputted;
a second transimpedance amplifier configured to convert a second current signal into a second voltage signal, wherein the second current signal is generated in a second photodiode, to which no optical signal is inputted;
a level shift circuit configured to shift at least one of the first voltage signal and the second voltage signal in a close direction and output it, wherein the close direction is a direction in which the center voltage of the amplitude of the first voltage signal and the voltage of the second voltage signal get closer, wherein the amplitude of the first voltage signal is generated based on a result of detection of light of the optical signal in the first photodiode; and
a differential amplifier to which the first voltage signal and the second voltage signal outputted from the level shift circuit are inputted, the differential amplifier configured to amplify a difference between the first voltage signal and the second voltage signal.

15. The optical signal receiving circuit according to claim 14, wherein the level shift circuit shifts the voltage of the first voltage signal in an opposite direction to an oscillation direction which is the direction of change of the first voltage signal when the light of the optical signal is detected by the first photodiode.

16. The optical signal receiving circuit according to claim 15, wherein the level shift circuit comprises:
a first resistance which is provided between an output of the first transimpedance amplifier and an input of the differential amplifier; and
an operational circuit configured to extract a current from a node between the first resistance and the input of the differential amplifier or feed a current to the node between the first resistance and the input of the differential amplifier.

17. The optical signal receiving circuit according to claim 16, wherein the level shift circuit further comprises a second resistance which is provided between an output of the second transimpedance amplifier and an input of the differential amplifier and which has substantially the same resistance value as the first resistance.

18. The optical signal receiving circuit according to claim 17, wherein the level shift circuit further comprises a peak hold circuit configured to hold a peak value of the first voltage signal, which is an output of the first transimpedance amplifier, as a peak value voltage for a predetermined time, the peak value voltage which is an output of the peak hold circuit and the second voltage signal which is an output of the second transimpedance amplifier are inputted to the operational circuit, and the operational circuit extracts the current from the node between the first resistance and the input of the differential amplifier according to a difference between the peak value voltage and the voltage of the second voltage signal or the operational circuit feeds the current to the node between the first resistance and the input of the differential amplifier according to a difference between the peak value voltage and the voltage of the second voltage signal.

19. The optical signal receiving circuit according to claim 14, wherein the level shift circuit shifts the voltage of the second voltage signal in an oscillation direction which is the direction of change of the first voltage signal when the light of the optical signal is detected by the first photodiode.

20. The optical signal receiving circuit according to claim 19, wherein the level shift circuit comprises:
a third resistance which is provided between an output of the second transimpedance amplifier and an input of the differential amplifier; and
an operational circuit configured to extract a predetermined amount of current from a node between the third resistance and the input of the differential amplifier or feed a predetermined amount of current to the node between the third resistance and the input of the differential amplifier.

21. The optical signal receiving circuit according to claim 20, wherein the level shift circuit further comprises a fourth resistance which is provided between an output of the first transimpedance amplifier and an input of the differential amplifier and which has substantially the same resistance value as the third resistance.

22. The optical signal receiving circuit according to claim 21, wherein the level shift circuit further comprises a peak hold circuit configured to hold a peak value of the first voltage signal, which is an output of the first transimpedance amplifier, as a peak value voltage for a predetermined time, the peak value voltage which is an output of the peak hold circuit and the second voltage signal which is an output of the second transimpedance amplifier are inputted to the operational circuit, the operational circuit extracts the current from the node between the third resistance and the input of the differential amplifier according to a difference between the peak value voltage and the voltage of the second voltage signal or the operational circuit feeds the current to the node between the third resistance and the input of the differential amplifier according to a difference between the peak value voltage and the voltage of the second voltage signal.

23. The optical signal receiving circuit according to claim 14, wherein the level shift circuit shifts at least one of the first voltage signal and the second voltage signal so that the second voltage signal is located in a central position of the amplitude of the first voltage signal.

24. The optical signal receiving circuit according to claim 14, wherein the output of the level shift circuit is directly inputted to the differential amplifier not via another circuit.

25. The optical signal receiving circuit according to claim 14, wherein the output of the level shift circuit is indirectly inputted to the differential amplifier via another circuit.

26. An optical signal receiving semiconductor device, comprising:

a first photodiode formed on a semiconductor chip, wherein an optical signal is inputted to the first photodiode so as to generate a first current signal;

a second photodiode formed on the semiconductor chip, wherein no optical signal is inputted to the second photodiode so as to generate a second current signal; and a optical signal receiving circuit, comprising:

a first transimpedance amplifier configured to convert the first current signal into a first voltage signal;

a second transimpedance amplifier configured to convert the second current signal into a second voltage signal;

a level shift circuit configured to shift at least one of the first voltage signal and the second voltage signal in a close direction and output it, wherein the close direction is a direction in which the center voltage of the amplitude of the first voltage signal and the voltage of the second voltage signal get closer, wherein the amplitude of the first voltage signal is generated based on a result of detection of light of the optical signal in the first photodiode; and a differential amplifier to which the first voltage signal and the second voltage signal outputted from the level shift circuit are inputted, the differential amplifier configured to amplify a difference between the first voltage signal and the second voltage signal.

* * * * *